US012765087B2

(12) United States Patent
Jang

(10) Patent No.: US 12,765,087 B2
(45) Date of Patent: Oct. 13, 2026

(54) IMAGE SENSING DEVICE

(71) Applicant: SK hynix Inc., Icheon-si (KR)

(72) Inventor: Jae Hyung Jang, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 889 days.

(21) Appl. No.: 17/993,297

(22) Filed: Nov. 23, 2022

(65) Prior Publication Data

US 2023/0246058 A1 Aug. 3, 2023

(30) Foreign Application Priority Data

Jan. 28, 2022 (KR) ........................ 10-2022-0013291

(51) Int. Cl.
*H10F 39/15* (2025.01)
*H10F 39/00* (2025.01)
*H10F 39/12* (2025.01)

(52) U.S. Cl.
CPC ....... *H10F 39/8027* (2025.01); *H10F 39/151* (2025.01); *H10F 39/153* (2025.01); *H10F 39/199* (2025.01); *H10F 39/8023* (2025.01); *H10F 39/8033* (2025.01); *H10F 39/813* (2025.01); *H10F 39/80373* (2025.01)

(58) Field of Classification Search
CPC .... H10F 39/151; H10F 39/153; H10F 39/199; H10F 39/8023; H10F 39/8027; H10F 39/8033; H10F 39/813
See application file for complete search history.

(56) References Cited

U.S. PATENT DOCUMENTS

| | | | |
|---|---|---|---|
| 9,264,676 B2 | 2/2016 | Cohen et al. | |
| 2014/0367552 A1 | 12/2014 | Hynecek et al. | |
| 2015/0256780 A1 | 9/2015 | Lin et al. | |
| 2020/0029047 A1* | 1/2020 | Jin | H10F 39/18 |
| 2020/0304741 A1 | 9/2020 | Dielacher et al. | |
| 2020/0314365 A1 | 10/2020 | Sano | |

(Continued)

FOREIGN PATENT DOCUMENTS

| | | |
|---|---|---|
| CN | 103855177 A | 6/2014 |
| CN | 104681571 A | 6/2015 |

(Continued)

OTHER PUBLICATIONS

Request for the Submission of an Opinion for KR Appl. No. 10-2022-0013291, issued Sep. 29, 2025, 9 pages with English translation.

(Continued)

*Primary Examiner* — Yara B Green
*Assistant Examiner* — Christopher M Roland
(74) *Attorney, Agent, or Firm* — Ashurst Perkins Coie US LLP

(57) ABSTRACT

An image sensing device includes a substrate including a back side structured to receive incident light and a front side opposite to the back side; imaging pixels to receive the incident light from the back side and each imaging pixel structured to produce photocharge in response to received incident light; a plurality of conductive contact structures configured to generate a potential gradient in the substrate and to capture photocharges that are generated in response to the incident light and move by the potential gradient; and a well region disposed between the plurality of conductive contact structures.

18 Claims, 8 Drawing Sheets

(56) References Cited

U.S. PATENT DOCUMENTS

| | | | | |
|---|---|---|---|---|
| 2021/0104569 | A1 | 4/2021 | Kwak et al. | |
| 2021/0134854 | A1* | 5/2021 | Poikonen | H10F 39/8033 |
| 2021/0141068 | A1 | 5/2021 | Franke et al. | |
| 2021/0159256 | A1 | 5/2021 | Tsuboi | |
| 2021/0210005 | A1 | 7/2021 | Zhou et al. | |
| 2021/0270941 | A1 | 9/2021 | Watanabe et al. | |
| 2021/0364604 | A1 | 11/2021 | Isogai et al. | |
| 2021/0408094 | A1* | 12/2021 | Jang | G01S 17/36 |
| 2022/0157866 | A1 | 5/2022 | Byun | |
| 2022/0208815 | A1* | 6/2022 | Jang | H10F 39/8037 |
| 2022/0223639 | A1 | 7/2022 | Jang | |
| 2023/0118540 | A1* | 4/2023 | Jang | H10F 39/12 257/292 |

FOREIGN PATENT DOCUMENTS

| | | | |
|---|---|---|---|
| CN | 112188128 | A | 1/2021 |
| CN | 212696100 | U | 3/2021 |
| CN | 113365006 | A | 9/2021 |
| CN | 113451338 | A | 9/2021 |
| CN | 115996324 | A | 4/2023 |
| EP | 3598167 | A1 | 1/2020 |
| KR | 20170040124 | A | 4/2017 |
| KR | 20200009643 | A | 1/2020 |
| KR | 20220000562 | A | 1/2022 |

OTHER PUBLICATIONS

Ebiko, Y. et al., "Low power consumption and high resolution 1280X960 Gate Assisted Photonic Demodulator pixel for indirect Time of flight," 2020 IEEE International Electron Devices Meeting (IEDM), pp. 721-724.

Notice of Allowance for CN Appl. No. 202211273071.X, mailed on Sep. 20, 2024, 4 pages.

Office Action for TW Appl. No. 111139440, mailed on Dec. 10, 2025, 10 pages.

Request for the Submission of an Opinion for KR Appl. No. 10-2021-0139184, mailed on Jun. 27, 2025, 12 pages with English translation.

Notice of Completion of Formalities for Patent Registration, issued Aug. 13, 2026 in Chinese Patent Application No. 202310087630.6, 8 pages, English translation.

* cited by examiner

IMAGE SENSING DEVICE

CROSS-REFERENCE TO RELATED APPLICATION

This patent document claims the priority and benefits of Korean patent application No. 10-2022-0013291, filed on Jan. 28, 2022, the disclosure of which is incorporated herein by reference in its entirety as part of the disclosure of this patent document.

TECHNICAL FIELD

The technology and implementations disclosed in this patent document generally relate to an image sensing device for sensing a distance to a target object.

BACKGROUND

An image sensing device is a device for capturing optical images by converting light into electrical signals using a photosensitive semiconductor material which reacts to light. With the development of automotive, medical, computer and communication industries, the demand for high-performance image sensing devices is increasing in various fields such as smart phones, digital cameras, game machines, IOT (Internet of Things), robots, security cameras and medical micro cameras.

The image sensing device may be roughly divided into CCD (Charge Coupled Device) image sensing devices and CMOS (Complementary Metal Oxide Semiconductor) image sensing devices. The CCD image sensing devices offer a better image quality, but they tend to consume more power and are larger as compared to the CMOS image sensing devices. The CMOS image sensing devices are smaller in size and consume less power than the CCD image sensing devices. Furthermore, CMOS sensors are fabricated using the CMOS fabrication technology, and thus photosensitive elements and other signal processing circuitry can be integrated into a single chip, enabling the production of miniaturized image sensing devices at a lower cost. For these reasons, CMOS image sensing devices are being developed for many applications including mobile devices.

SUMMARY

Various embodiments of the disclosed technology relate to an image sensing device including a time of flight (ToF) pixel capable of sensing a distance to a target object.

In one aspect, an image sensing device is provided to include a substrate including a back side structured to receive incident light and a front side opposite to the back side; imaging pixels to receive the incident light from the back side and each imaging pixel structured to produce photocharge in response to received incident light; a plurality of conductive contact structures configured to generate a potential gradient in the substrate and to capture photocharges that are generated in response to the incident light and move by the potential gradient; and a well region disposed between the plurality of conductive contact structures. Each conductive contact structure includes: a control node doped with impurities of a first conductivity type in the substrate; a detection node doped with impurities of a second conductivity type different from the first conductivity type in the substrate; and a control gate including a gate electrode and a gate insulation layer for electrically isolating the gate electrode and the substrate from each other.

In another aspect, an image sensing device is provided to include a substrate including a back side structured to receive incident light and a front side opposite to the back side; an imaging pixel supported by the substrate to receive the incident light from the back side and structured to produce photocharge in response to the received incident light; a plurality of taps disposed in the imaging pixel, each tap configured to generate a potential gradient in the substrate and to capture photocharges that are generated in response to the incident light and move by the potential gradient; and a well region disposed between the plurality of taps such that at least a portion of the well region overlaps with each of the taps. Each of the taps includes: a control node doped with impurities of a first conductivity type in the substrate; a detection node doped with impurities of a second conductivity type different from the first conductivity type in the substrate; and a control gate formed to include a gate electrode and a gate insulation layer for electrically isolating the gate electrode and the substrate from each other, wherein the control node, the detection node, and the control gate of the tap are sequentially arranged in a diagonal direction of a pixel including the tap.

In another aspect, an image sensing device is provided to include a substrate including a back side structured to receive incident light and a front side opposite to the back side; a plurality of taps, each tap is configured to generate a potential gradient in the substrate and to capture photocharges that are generated in response to the incident light and move by the potential gradient; and a well region disposed between the plurality of taps. Each of the taps includes: a control node doped with impurities of a first conductivity type in the substrate; a detection node doped with impurities of a second conductivity type different from the first conductivity type in the substrate; and a control gate formed to include a gate electrode and a gate insulation layer for electrically isolating the gate electrode and the substrate from each other, wherein a depth of the well region from the front side is smaller than a depth of the control node from the front side.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

This patent document provides implementations and examples of an image sensing device for sensing a distance to a target object, that may be used in configurations to substantially address one or more technical or engineering issues and to mitigate limitations or disadvantages encountered in some other image sensing devices. Some implementations of the disclosed technology relate to an image sensing device including the time of flight (ToF) pixel capable of sensing the distance to a target object. The disclosed technology provides various implementations of an image sensing device that can improve performance of the ToF pixel while reducing power consumed in the ToF pixel.

Hereafter, various embodiments will be described with reference to the accompanying drawings. However, it should be understood that the disclosed technology is not limited to specific embodiments, but includes various modifications, equivalents and/or alternatives of the embodiments. The embodiments of the disclosed technology may provide a variety of effects capable of being directly or indirectly recognized through the disclosed technology.

Technologies of measuring a depth (e.g., a distance to a target object) using an image sensor have been being developed through much research, and demand for the technologies of measuring the depth have been increasing in various devices such as security devices, medical devices, vehicles, game machines, virtual reality (VR)/augmented reality (AR) devices, and mobile device. Examples of methods of measuring a depth may include triangulation, TOF (Time of Flight) and interferometry. Among the above-mentioned depth measurement methods, the time of flight (TOF) method becomes popular because of its wide range of utilization, high processing speed, and cost advantages.

The TOF method measures a distance using emitted light and reflected light. The TOF method may be roughly classified into a direct method and an indirect method, depending on whether it is a round-trip time or the phase difference that determines the distance. The direct method may measure a distance by calculating a round trip time and the indirect method may measure a distance using a phase difference. Since the direct method is suitable for measuring a long distance, the direct method is widely used in automobiles. The indirect method is suitable for measuring a short distance and thus widely used in various higher-speed devices designed to operate at a higher speed, for example, game consoles or mobile cameras. As compared to the direct type TOF systems, the indirect method has several advantages including having a simpler circuitry, low memory requirement, and a relatively lower cost.

Figure 1:
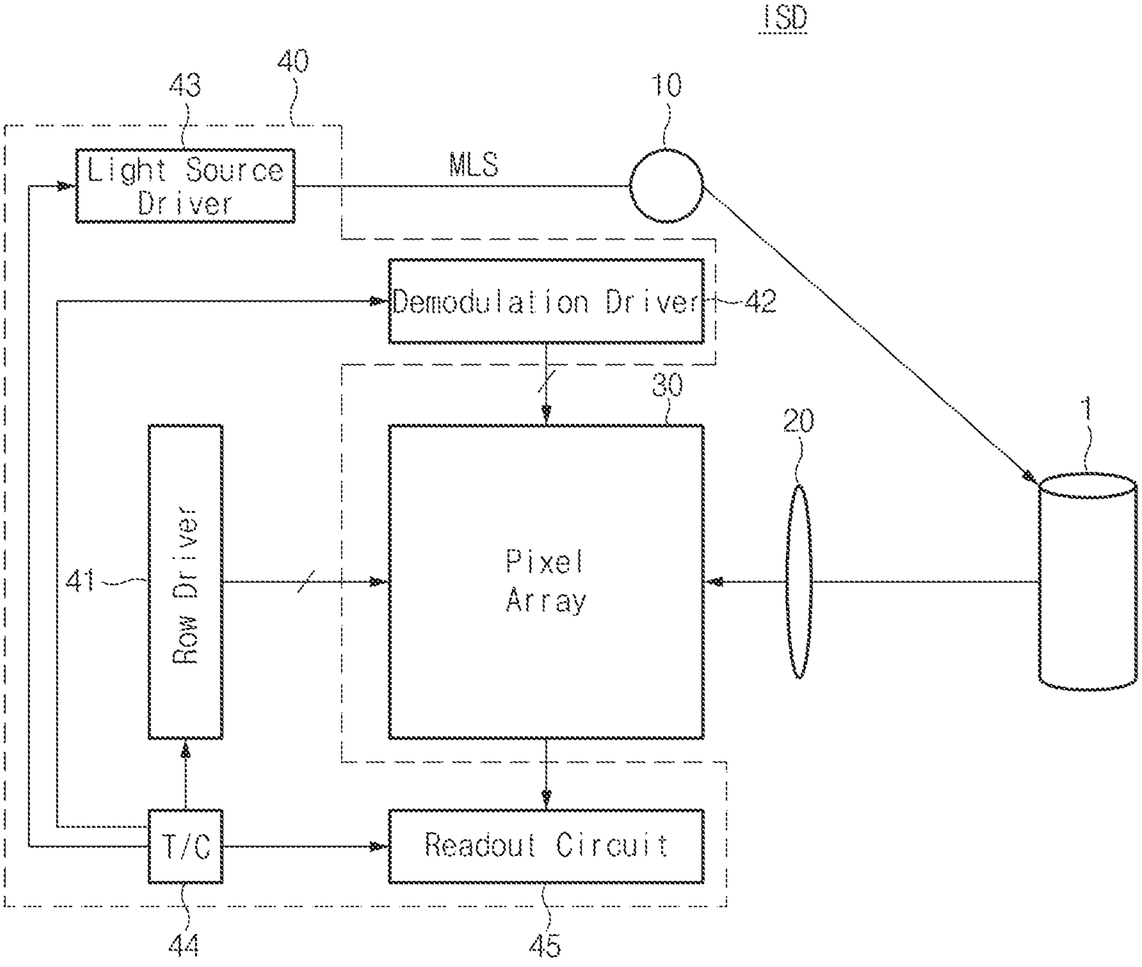
FIG. 1 is a block diagram illustrating an example of an image sensing device based on some implementations of the disclosed technology.

FIG. 1 is a block diagram illustrating an example of an image sensing device ISD based on some implementations of the disclosed technology.

Referring to FIG. 1, the image sensing device ISD may measure the distance to a target object 1 using the Time of Flight (TOF) principle. The TOF method may be mainly classified into a direct TOF method and an indirect TOF method. After light has been emitted from a light source to the target object 1, the direct TOF method may measure a time duration in which light is reflected from the target object 1 and returns to the image sensing device ISD, such that the direct TOF method may calculate the distance to the target object 1 using the measured time duration. The indirect TOF method may emit modulated light to the target object 1, may sense light reflected from the target object 1, may calculate a phase difference between the modulated light and the reflected light, and may thus indirectly measure the distance between the image sensing device ISD and the target object 1. Although the image sensing device ISD based on some implementations of the disclosed technology is designed to use the indirect TOF method, the scope or spirit of the disclosed technology is not limited thereto. In addition, the target object 1 does not mean only one independent object, but may mean a scene captured by the image sensing device ISD.

The image sensing device ISD may include a light source 10, a lens module 20, a pixel array 30, and a control block 40.

The light source 10 may emit light to a target object 1 upon receiving a modulated light signal (MLS) from the control block 40. The light source 10 may be a laser diode (LD) or a light emitting diode (LED) for emitting light (e.g., near infrared (NIR) light, infrared (IR) light or visible light) having a specific wavelength band, or may be any one of a Near Infrared Laser (NIR), a point light source, a monochromatic light source combined with a white lamp or a monochromator, and a combination of other laser sources. For example, the light source 10 may emit infrared light having a wavelength of 800 nm to 1000 nm. Light emitted from the light source 10 may be light (i.e., modulated light) modulated by a predetermined frequency. Although FIG. 1 shows only one light source 10 for convenience of description, the scope or spirit of the disclosed technology is not limited thereto, and a plurality of light sources may also be arranged in the vicinity of the lens module 20.

The lens module 20 may collect light reflected from the target object 1, and may allow the collected light to be focused onto pixels (PXs) of the pixel array 30. For example, the lens module 20 may include a focusing lens having a surface formed of glass or plastic or another cylindrical optical element having a surface formed of glass or plastic. The lens module 20 may include a plurality of lenses that is arranged to be focused upon an optical axis.

The pixel array 30 may include unit pixels (PXs) consecutively arranged in a two-dimensional (2D) matrix structure in which unit pixels are arranged in a column direction and a row direction perpendicular to the column direction. The unit pixels (PXs) may be formed over a semiconductor substrate. Each unit pixel (PX) may convert incident light received through the lens module 20 into an electrical signal corresponding to the amount of incident light, and may thus output a pixel signal using the electrical signal. In this case, the pixel signal may be a signal indicating the distance to the target object 1. The structure and operations of each unit pixel (PX) will hereinafter be described with reference to FIG. 2 and more figures.

The control block 40 may emit light to the target object 1 by controlling the light source 10, may process each pixel signal corresponding to light reflected from the target object 1 by driving unit pixels (PXs) of the pixel array 30, and may measure the distance to the surface of the target object 1 using the processed result.

The control block 40 may include a row driver 41, a demodulation driver 42, a light source driver 43, a timing controller (T/C) 44, and a readout circuit 45.

The row driver 41 and the demodulation driver 42 may be generically called a control circuit for convenience of description.

The control circuit may drive unit pixels (PXs) of the pixel array 30 in response to a timing signal generated from the timing controller 44.

The control circuit may generate a control signal capable of selecting and controlling at least one row line from among the plurality of row lines. The control signal may include a demodulation control signal for generating a pixel current in the substrate, a reset signal for controlling a reset transistor, a transmission (Tx) signal for controlling transmission of photocharges accumulated in a detection node, a floating diffusion (FD) signal for providing additional electrostatic capacity at a high illuminance level, a selection signal for controlling a selection transistor, and the like.

In this case, the row driver 41 may generate a reset signal, a transmission (Tx) signal, a floating diffusion (FD) signal, and a selection signal, and the demodulation driver 42 may generate a demodulation control signal. Although the row driver 41 and the demodulation driver 42 based on some implementations of the disclosed technology are configured independently of each other, the row driver 41 and the demodulation driver 42 based on some other implementations may be implemented as one constituent element that can be disposed at one side of the pixel array 30 as needed.

The light source driver 43 may generate a modulated light signal MLS capable of driving the light source 10 in response to a control signal from the timing controller 44. The modulated light signal MLS may be a signal that is modulated by a predetermined frequency.

The timing controller 44 may generate a timing signal to control the row driver 41, the demodulation driver 42, the light source driver 43, and the readout circuit 45.

The readout circuit 45 may process pixel signals received from the pixel array 30 under control of the timing controller 44, and may thus generate pixel data formed in a digital signal form. To this end, the readout circuit 45 may include a correlated double sampler (CDS) circuit for performing correlated double sampling (CDS) on the pixel signals generated from the pixel array 30. In addition, the readout circuit 45 may include an analog-to-digital converter (ADC) for converting output signals of the CDS circuit into digital signals. In addition, the readout circuit 45 may include a buffer circuit that temporarily stores pixel data generated from the analog-to-digital converter (ADC) and outputs the pixel data under control of the timing controller 44. In the meantime, two column lines for transmitting the pixel signal may be assigned to each column of the pixel array 30, and structures for processing the pixel signal generated from each column line may be configured to correspond to the respective column lines.

The light source 10 may emit light (i.e., modulated light) modulated by a predetermined frequency to a scene captured by the image sensing device ISD. The image sensing device ISD may sense modulated light (i.e., incident light) reflected from the target objects 1 included in the scene, and may thus generate depth information for each unit pixel (PX). A time delay based on the distance between the image sensing device ISD and each target object 1 may occur between the modulated light and the incident light. The time delay may be denoted by a phase difference between the signal generated by the image sensing device ISD and the light modulation signal MLS controlling the light source 10. An image processor (not shown) may calculate a phase difference generated in the output signal of the image sensing device ISD, and may thus generate a depth image including depth information for each unit pixel (PX).

Figure 2:
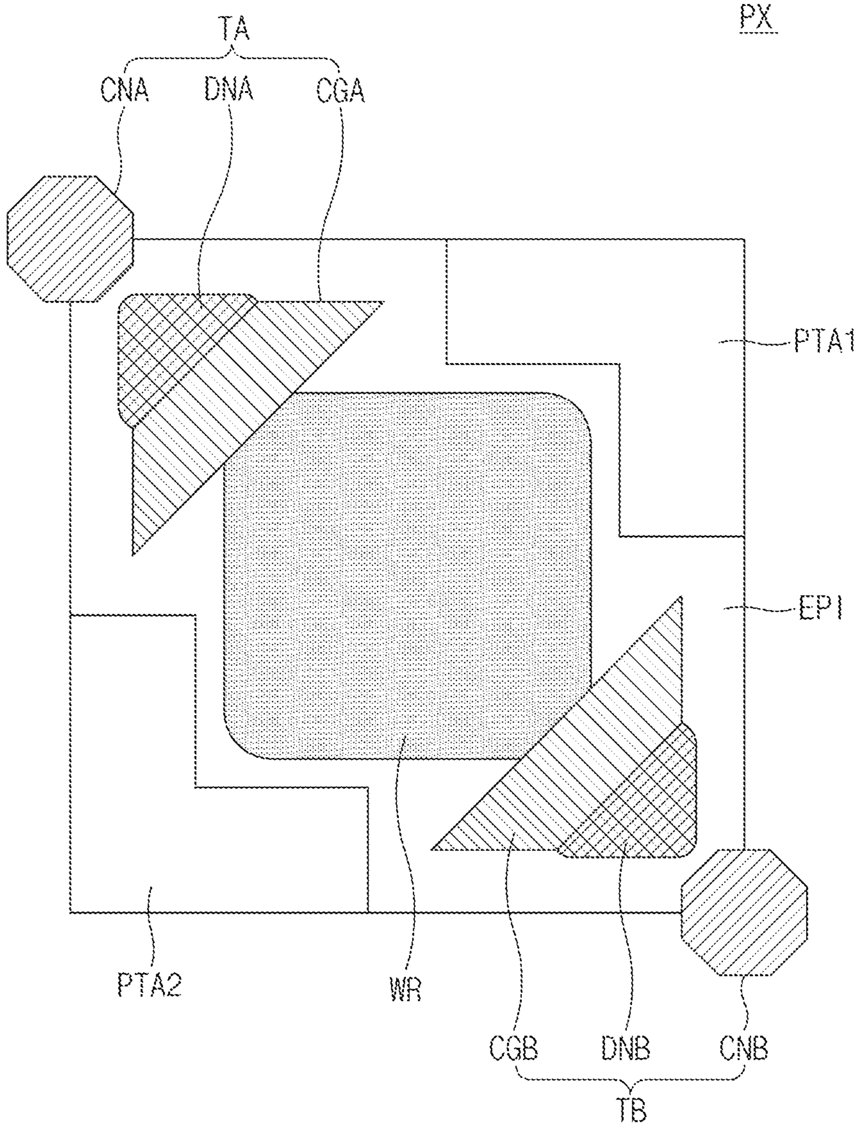
FIG. 2 is a schematic diagram illustrating an example of a layout structure of a pixel shown in FIG. 1 based on some implementations of the disclosed technology.

FIG. 2 is a schematic diagram illustrating an example of a layout structure of the pixel PX shown in FIG. 1 based on some implementations of the disclosed technology.

Referring to FIG. 2, the pixel PX may correspond to a unit pixel included in the pixel array 30 shown in FIG. 1. The pixel PX may include a first tap TA, a second tap TB, a well region WR, a first pixel transistor region PTA1, a second pixel transistor region PTA2, and an epitaxial region EPI. Although the example as shown in FIG. 2 shows two taps TA and TB contained in one pixel PX, other implementations with additional taps are also possible. For example, at least three taps may be contained in one pixel PX in some implementations. In implementations, the different taps in one pixel PX may receive the same demodulation control signal or may receive different kinds of demodulation control signals (or demodulation control signals having different time points). Each tap refers to an electrical contact structure (or conductive contact structure) which is configured to receive or output an electrical signal and can be referred to as an electrical contact tap.

Although the example of FIG. 2 shows that the first tap TA and the second tap TB are arranged in a diagonal direction, other implementations are also possible. For example, the first tap TA and the second tap TB can also be arranged in a horizontal direction (a row direction) or in a vertical direction (a column direction).

In the specific example in FIG. 2, the first tap TA may be implemented as an electrical contact structure that includes a first conductive contact node as a first control node CNA, a second conductive contact node as a first detection node DNA, and a third conductive contact node as a first control gate CGA. Although the FIG. 2 illustrates the example that the first control node CNA is formed in an octagonal shape, the first detection node DNA is formed in a generally triangular shape, and the first control gate CGA is formed in a trapezoidal shape, other implementations are also possible. In the example in FIG. 2, the first control node CNA is located at borders of, and is shared by, adjacent pixels such as four adjacent pixels constituting a (2×2) matrix. The first control node CNA may have a shape (e.g., a circular shape or octagonal shape) that is symmetrical with respect to certain directions, e.g., the vertical, horizontal, and diagonal directions of the (2×2) matrix.

The first control node CNA may be disposed at a first vertex of the pixel PX (or to overlap with the first vertex). In some implementations, one pixel may be formed in a rectangular shape having first to fourth vertices. Based on a center point of the pixel, a vertex located at a left-upper side from the center point will hereinafter be referred to as a first vertex, a vertex located at a right-upper side from the center point will hereinafter be referred to as a second vertex, a vertex located at a left-lower side from the center point will hereinafter be referred to as a third vertex, and a vertex located at a right-lower side from the center point will hereinafter be referred to as a fourth vertex. The first vertex and the fourth vertex may be arranged to face each other in a first diagonal direction (i.e., in a direction in which the first vertex and the fourth vertex are connected to each other), and the second vertex and the third vertex may be arranged to face each other in a second diagonal direction (i.e., in a direction in which the second vertex and the third vertex are connected to each other) different from the first diagonal direction. Each of the first diagonal direction and the second diagonal direction may be defined as a diagonal direction of the pixel PX.

In the example in FIG. 2, different from the first control node CNA, the first detection node DNA and first control gate CGA are designated to one pixel and are not shared with adjacent pixels. The first detection node DNA may be formed to occupy a region as large as possible while being disposed as close as possible to the first control node CNA and the first control gate CGA. The first detection node DNA formed in the above-mentioned shape can more easily capture signal carriers moving along a potential gradient formed by the first control node CNA and the first control gate CGA.

The first detection node DNA may be spaced apart from the first control node CNA by a predetermined distance in a manner that the first detection node DNA can be disposed closer to the center point of the pixel PX in the first diagonal direction than the first control node CNA. In some implementations, unlike FIG. 2, the first control node CNA and the first detection node DNA may be arranged to be in contact with each other such that the first control node CNA and the first detection node DNA can be physically isolated from each other using only junction isolation caused by opposite doping. In some implementations, at least a portion of the first detection node DNA may be disposed to overlap or contact the first control gate CGA.

The first control gate CGA designated for a pixel PX may be disposed to overlap or contact the first detection node DNA in a manner that the first control gate CGA can be disposed closer to the center point of the pixel PX in the first diagonal direction than the first detection node DNA. The first control gate CGA may be formed in a trapezoidal shape that includes an upper side contacting the first detection node DNA and a lower side located closer to the center point of the pixel PX. Due to this trapezoidal shape, a potential gradient can be formed over a wider area.

The first control node CNA, the first detection node DNA, and the first control gate CGA may be sequentially arranged in the first diagonal direction, the first control node CNA may be disposed at one side of the first detection node DNA, and the first control gate CGA may be disposed at the other side of the first detection node DNA. In addition, the first detection node DNA may be disposed between the first control node CNA and the first control gate CGA.

In the example in FIG. 2, similarly constructed as the first tap TA but located at a different position within the pixel, the second tap TB may include a second control node CNB, a second detection node DNB, and a second control gate CGB. The second tap TB may be disposed to be symmetrical with the first tap TA with reference to the center point of the pixel PX where the second control node CNB may be located at borders of, and is shared by, adjacent pixels while the second detection node DNB and second control gate CGB are designated to the pixel. In FIG. 2, the second control node CNB may be disposed at the fourth vertex of the pixel PX (or to overlap with the fourth vertex). The second control node CNB, the second detection node DNB, and the second control gate CGB may correspond to the first control node CNA, the first detection node DNA, and the first control gate CGA, respectively, and as such redundant description thereof will herein be omitted for brevity.

The first and second control nodes CNA and CNB may be doped with impurities of a first conductivity type (e.g., P-type), and the first and second detection nodes DNA and DNB may be doped with impurities of a second conductivity type (e.g., N-type).

Each of the first and second control gates CGA and CGB may be arranged in a planar shape on one surface (e.g., a front surface) of the substrate, and may include a gate insulation layer configured to electrically isolate the substrate from the gate electrode, and a gate electrode configured to receive the demodulation control signal. For example, the gate insulation layer may include at least one of a silicon oxynitride film ($Si_xO_yN_z$, where each of 'x', 'y', and 'z' is a natural number), a silicon oxide film ($Si_xO_y$, where each of 'x' and 'y' is a natural number), or a silicon nitride film ($Si_xN_y$, where each of 'x' and 'y' is a natural number). The gate electrode may include at least one of polysilicon and metal.

The well region WR may provide a potential gradient toward the first and second control gates CGA and CGB.

The well region WR may be disposed between the first and second control gates CGA and CGB so that at least a portion thereof overlaps with each of the first and second control gates CGA and CGB. The well region WR may be disposed over as large a region as possible within a range that does not overlap with the first and second pixel transistor regions PTA1 and PTA2. This serves to allow much more signal carriers to move along a potential gradient provided by the well region WR.

The well region WR may be a region doped with impurities of a first conductivity type (e.g., P-type).

Figure 3:
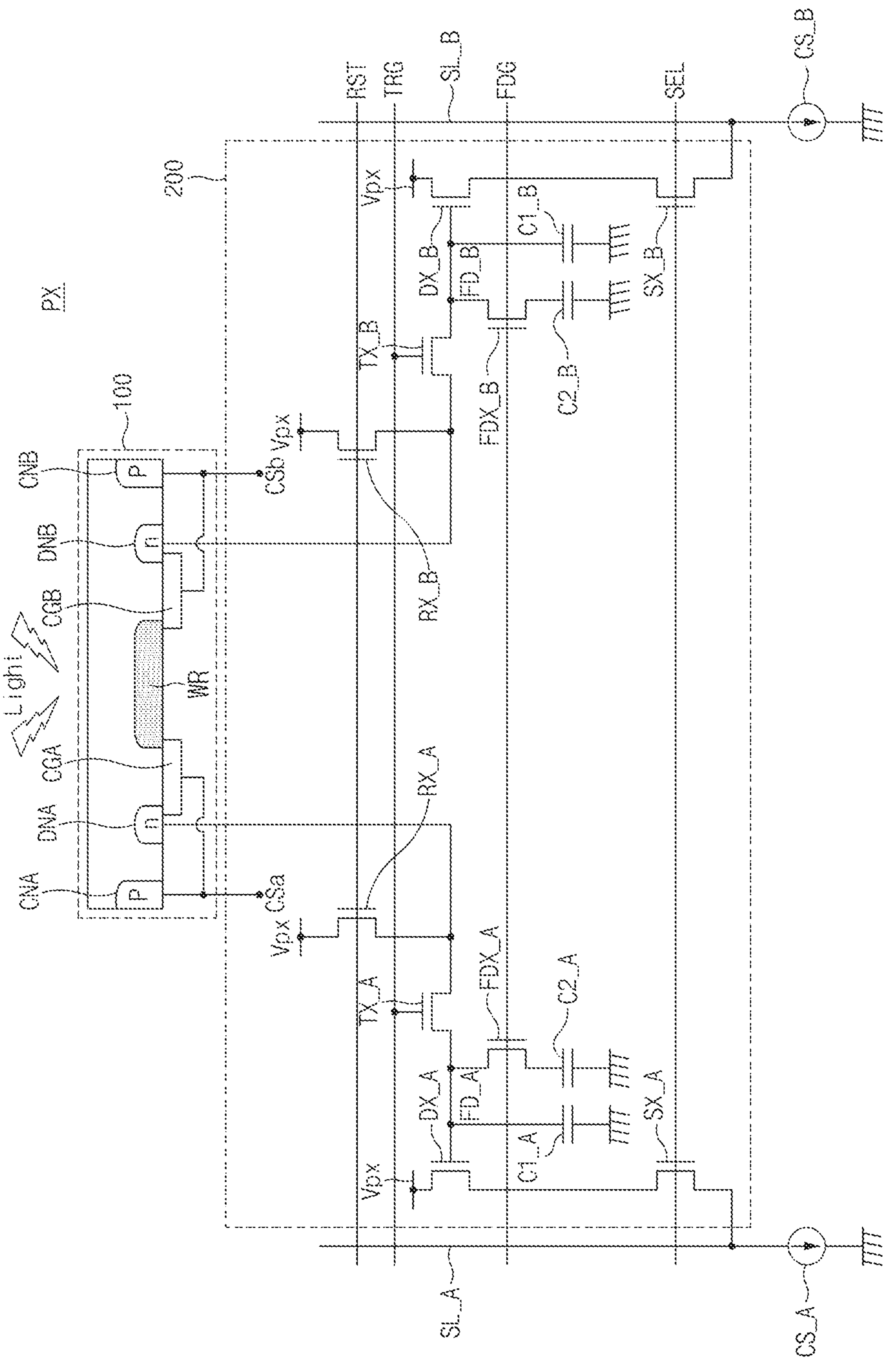
FIG. 3 is a diagram illustrating an example of operations of the pixel shown in FIG. 2 based on some implementations of the disclosed technology.

FIG. 3 is a diagram illustrating an example of operations of the pixel shown in FIG. 2 based on some implementations of the disclosed technology. In the example in FIGS. 2 and 3, a first pixel transistor region PTA1 may include pixel transistors (see TX_A, RX_A, FDX_A, DX_A, and SX_A shown in FIG. 3) for processing photocharges captured by the first tap TA. A second pixel transistor region PTA2 may include pixel transistors (see TX_B, RX_B, FDX_B, DX_B, and SX_B shown in FIG. 3) for processing photocharges captured by the second tap TB. In some other implementations, the first pixel transistor region PTA1 may include pixel transistors associated with the second tap TB, and the second pixel transistor region PTA2 may include pixel transistors associated with the first tap TA.

The first pixel transistor region PTA1 may have a shape that extends toward each of the first and fourth vertices of the pixel PX while contacting the second vertex of the pixel PX. The second pixel transistor region PTA2 may have a shape that extends toward each of the first and fourth vertices of the pixel PX while contacting the third vertex of the pixel PX. In the example, each of the first pixel transistor region PTA1 and the second pixel transistor region PTA2 has two portions extending toward to different vertices of the pixel PX that are located along the diagonal direction. In some implementations, the pixel transistors included in each of the first and second pixel transistor regions PTA1 and PTA2 may be arranged in a line along a boundary between adjacent pixels, but other implementations are also possible.

Each of the transistors included in the first and second pixel transistor regions PTA1 and PTA2 may include a gate region formed of or including a gate electrode disposed at an insulation layer formed at one surface of the substrate, a source and drain region formed of impurity regions disposed at both sides of the gate electrode in the substrate, and a channel region corresponding to a lower region of the gate electrode in the substrate. In some implementations, the source and drain region may be surrounded by a well region doped with P-type impurities to a predetermined density, and the well region may also extend to a lower region of the gate electrode to form a body of each pixel transistor. Each of the first and second pixel transistor regions PTA1 and PTA2 may further include a terminal (e.g., a high-density doped region contacting the well region) for supplying a body voltage (e.g., a ground voltage) to the well region.

In some implementations, the substrate may refer to a substrate on which an epitaxial layer is grown. The epitaxial region EPI may include the remaining regions other than constituent elements formed in the substrate, the first pixel transistor region PTA1 and the second pixel transistor region PTA2. For example, the epitaxial region may refer to an N-type or P-type epitaxial layer.

In the example in FIG. 3, the pixel PX may include a photoelectric conversion region 100 and a circuit region 200.

The photoelectric conversion region 100 may correspond to a cross-sectional region obtained when the pixel is taken along the line passing through the first tap TA and the second tap TB. In FIG. 3, the photoelectric conversion region 100 is schematically illustrated with example elements that directly perform a photoelectric conversion operation. In some implementations, the photoelectric conversion region 100 may include additional elements.

The photoelectric conversion region 100 may include first and second control nodes CNA and CNB, first and second detection nodes DNA and DNB, and first and second control gates CGA and CGB.

The first and second control nodes CNA and CNB, the first and second detection nodes DNA and DNB, and the well region WR may be formed in a semiconductor substrate, and the first and second control gates CGA and CGB may be formed on the semiconductor substrate. The well region WR is not directly connected to an equivalent circuit included in the pixel PX, but may provide a potential gradient that assists flow of signal carriers.

The first control node CNA and the first control gate CGA may receive the first demodulation control signal (CSa) from the demodulation driver 42, and the second control node CNB and the second control gate CGB may receive the second demodulation control signal (CSb) from the demodulation driver 42. A voltage difference between the first demodulation control signal (CSa) and the second demodulation control signals (CSb) may generate a potential gradient for controlling the flow of signal carriers that are generated in the substrate in response to incident light. When the first demodulation control signal (CSa) has a higher voltage than the second demodulation control signal (CSb), a potential gradient increasing from the second tap TB to the first tap TA may be formed. When the first demodulation control signal (CSa) has a lower voltage than the second demodulation control signal (CSb), a potential gradient increasing from the first tap TA to the second tap TB may be formed. Signal carriers generated in the substrate may move from a low-potential region to a high-potential region according to distribution of a potential gradient.

Each of the first detection node DNA and the second detection node DNB may capture signal carriers moving along the potential gradient generated in the substrate, and may accumulate the captured signal carriers.

In some implementations, the operation of capturing photocharges of the photoelectric conversion region 100 may be performed over a first time period and a second time period following the first period.

In the first time period, light incident upon the pixel PX may be processed by photoelectric conversion, such that a pair of an electron and a hole may occur in the substrate according to the amount of incident light. In some implementations, electrons generated in response to the amount of incident light may refer to photocharges. In this case, the demodulation driver 42 may output a first demodulation control signal (CSa) to the first control node CNA and the first control gate CGA, and may output a second demodulation control signal (CSb) to the second control node CNB and the second control gate CGB. In the first time period, the first demodulation control signal (CSa) may have a higher voltage than the second demodulation control signal (CSb). In this case, the voltage of the first demodulation control signal (CSa) may be defined as an active voltage (also called an activation voltage), and the voltage of the second demodulation control signal (CSb) may be defined as an inactive voltage (also called a deactivation voltage). For example, the voltage of the first demodulation control signal (CSa) may be set to 1.2 V, and the voltage of the second demodulation control signal (CSb) may be zero volts (OV).

An electric field may occur between the first tap TA and the second tap TB due to a difference in voltage between the first demodulation control signal (CSa) and the second demodulation control signal (CSb), and there may occur a potential gradient in which a potential increases from the second tap TB to the first tap TA. Thus, electrons in the substrate may move toward the first tap TA.

Electrons may be generated in the substrate in response to incident light and the amount of electrons generated may correspond to the amount of incident light. The generated electrons may move toward the first tap TA such that the electrons may be captured by the first detection node DNA.

In the second time period subsequent to the first time period, light incident upon the pixel PX may be processed by photoelectric conversion, and a pair of an electron and a hole may occur in the substrate according to the amount of incident light (i.e., intensity of incident light). In this case, the demodulation driver 42 may output the first demodulation control signal (CSa) to the first control node CNA and the first control gate CGA, and may output the second demodulation control signal (CSb) to the second control node CNB and the second control gate CGB. In the second time period, the first demodulation control signal (CSa) may have a lower voltage than the second demodulation control signal (CSb). In this case, the voltage of the first demodulation control signal (CSa) may hereinafter be defined as an inactive voltage (i.e., deactivation voltage), and the voltage of the second demodulation control signal (CSb) may hereinafter be defined as an active voltage (i.e., activation voltage). For example, the voltage of the first demodulation control signal (CSa) may be zero volts (OV), and the voltage of the second demodulation control signal (CSb) may be set to 1.2 V.

An electric field may occur between the first tap TA and the second tap TB due to a difference in voltage between the first demodulation control signal (CSa) and the second demodulation control signal (CSb), and there may occur a potential gradient in which a potential increases from the first tap TA to the second tap TB. Thus, electrons in the substrate may move toward the second tap TB.

Thus, electrons may be generated in the substrate in response to incident light and the amount of electrons generate may correspond to the amount of incident light. The generated electrons may move toward the second tap TB, such that the electrons may be captured by the second detection node DNB.

In some implementations, the order of the first time period and the second time period may also be changed as necessary.

Although FIG. 3 shows an example in which the pixel PX operates according to the 2-phase demodulation scheme designed based on the first demodulation control signal (CSa) and the second demodulation control signal (CSb) having opposite phases (i.e., the first demodulation control signal (CSa) having a phase difference of 0° with respect to the modulated light and the second demodulation control signal (CSb) having a phase difference of 180° with respect to the modulated light), other implementations are also possible. For example, the first demodulation control signal (CSa) may sequentially have a phase difference of 0° and a phase difference of 90° with respect to the modulated light, and at the same time the second demodulation control signal (CSb) may sequentially have a phase difference of 180° and a phase difference of 270° with respect to the modulated light, so that the pixel PX may also operate according to the 4-phase demodulation scheme.

The circuit region 200 may include a plurality of elements for processing photocharges captured by the first and second detection nodes DNA and DNB and converting the photocharges into electrical signals. The circuit region 200 may include elements (e.g., transistors) disposed in the first and second pixel transistor regions PTA1 and PTA2 included in the pixel PX shown in FIG. 2, and interconnect lines for electrical connection between the elements. For convenience of description, a detailed description thereof will be given later with reference to the circuit diagram shown in FIG. 3. Control signals RST, TRG, FDG, and SEL applied to the plurality of elements may be supplied from the row driver 41. In addition, a pixel voltage (Vpx) may be a power-supply voltage (VDD).

Elements for processing photocharges captured by the first detection node DNA will hereinafter be described with reference to the attached drawings. The circuit region 200 may include a reset transistor RX_A, a transfer transistor TX_A, a first capacitor C1_A, a second capacitor C2_A, a floating diffusion (FD) transistor FDX_A, a drive transistor DX_A, and a selection transistor SX_A.

The reset transistor RX_A may be activated to enter an active state in response to a logic high level of the reset signal RST supplied to a gate electrode thereof, such that potential of the floating diffusion (FD) node FD_A and potential of the first detection node DNA may be reset to a predetermined level (i.e., the pixel voltage Vpx). In addition, when the reset transistor RX_A is activated (i.e., active state), the transfer transistor TX_A can also be activated (i.e., active state) to reset the floating diffusion (FD) node FD_A.

The transfer transistor TX_A may be activated (i.e., active state) in response to a logic high level of the transfer signal TRG supplied to a gate electrode thereof, such that charges accumulated in the first detection node DNA can be transmitted to the floating diffusion (FD) node FD_A.

The first capacitor C1_A may be coupled to the floating diffusion (FD) node FD_A, such that the first capacitor C1_A can provide predefined electrostatic capacity.

The second capacitor C2_A may be selectively coupled to the floating diffusion (FD) node FD_A according to operations of the floating diffusion (FD) transistor FDX_A, such that the second capacitor C2_A can provide additional predefined electrostatic capacity.

Each of the first capacitor C1_A and the second capacitor C2_A may be comprised of, for example, at least one of a Metal-Insulator-Metal (MIM) capacitor, a Metal-Insulator-Polysilicon (MIP) capacitor, a Metal-Oxide-Semiconductor (MOS) capacitor, and a junction capacitor.

The floating diffusion (FD) transistor FDX_A may be activated (i.e., active state) in response to a logic high level of the floating diffusion (FD) signal FDG supplied to a gate electrode thereof, such that the floating diffusion (FD) transistor FDX_A may couple the second capacitor C2_A to the floating diffusion (FD) node FD_A.

For example, the row driver 41 may activate the floating diffusion (FD) transistor FDX_A when the amount of incident light corresponds to a relatively high illuminance condition, such that the floating diffusion (FD) transistor FDX_A enters the active state and the floating diffusion (FD) node FD_A can be coupled to the second capacitor C2_A. As a result, when the amount of incident light corresponds to a high illuminance level, the floating diffusion (FD) node FD_A can accumulate much more photocharges therein, resulting in guarantee of a high dynamic range (HDR).

When the amount of incident light is at a relatively low illuminance level, the row driver 41 may control the floating diffusion (FD) transistor FDX_A to be deactivated (i.e., inactive state), such that the floating diffusion (FD) node FD_A can be isolated from the second capacitor C2_A.

In some other implementations, the floating diffusion (FD) transistor FDX_A and the second capacitor C2_A may be omitted as necessary.

A drain electrode of the drive transistor DX_A is coupled to the pixel voltage (Vpx) and a source electrode of the drive transistor DX_A is coupled to a vertical signal line SL_A through the selection transistor SX_A, such that a load (MOS) and a source follower circuit of a constant current source circuit CS_A coupled to one end of the vertical signal line SL_A can be constructed. Thus, the drive transistor DX_A may output a current corresponding to potential of the floating diffusion node FD_A coupled to a gate electrode thereof to the vertical signal line SL_A through the selection transistor SX_A.

The selection transistor SX_A may be activated (i.e., active state) in response to a logic high level of the selection signal SEL supplied to a gate electrode thereof, such that the pixel signal generated from the drive transistor DX_A can be output to the vertical signal line SL_A.

In order to process photocharges captured by the second detection node DNB, the circuit region 200 may include a reset transistor RX_B, a transfer transistor TX_B, a first capacitor C1_B, a second capacitor C2_B, a floating diffusion (FD) transistor FDX_B, a drive transistor DX_B, and a selection transistor SX_B. Whereas the elements for processing photocharges captured by the second detection node DNB have operation time points different from those of other elements for processing photocharges captured by the first detection node DNA, the elements for processing photocharges captured by the second detection node DNB may be substantially identical in structure and operation to the other elements for processing photocharges captured by the first detection node DNA, and as such a detailed description thereof will herein be omitted.

The pixel signal transferred from the circuit region 200 to the vertical signal line SL_A and the pixel signal transferred from the circuit region 200 to the vertical signal line SL_B may be processed by noise cancellation and analog-to-digital conversion (ADC) processing, such that each of the pixel signals can be converted into image data.

Although each of the reset signal RST, the transmission signal TRG, the floating diffusion (FD) signal FDG, and the selection signal SEL shown in FIG. 3 is denoted by one signal line, each of the reset signal RST, the transmission signal TRG, the floating diffusion (FD) signal FDG, and the selection signal SEL can be supplied through a plurality of signal lines (e.g., two signal lines), such that elements for processing photocharges captured by the first detection node DNA and the other elements for processing photocharges captured by the second detection node DNB can operate at different time points.

The image processor (not shown) may calculate image data acquired from photocharges captured by the first detection node DNA and other image data acquired from photocharges captured by the second detection node DNB, such that the image processor may calculate a phase difference using the calculated image data. The image processor may calculate depth information indicating the distance to the target object 1 based on a phase difference corresponding to each pixel, and may generate a depth image including depth information corresponding to each pixel.

Figure 4:
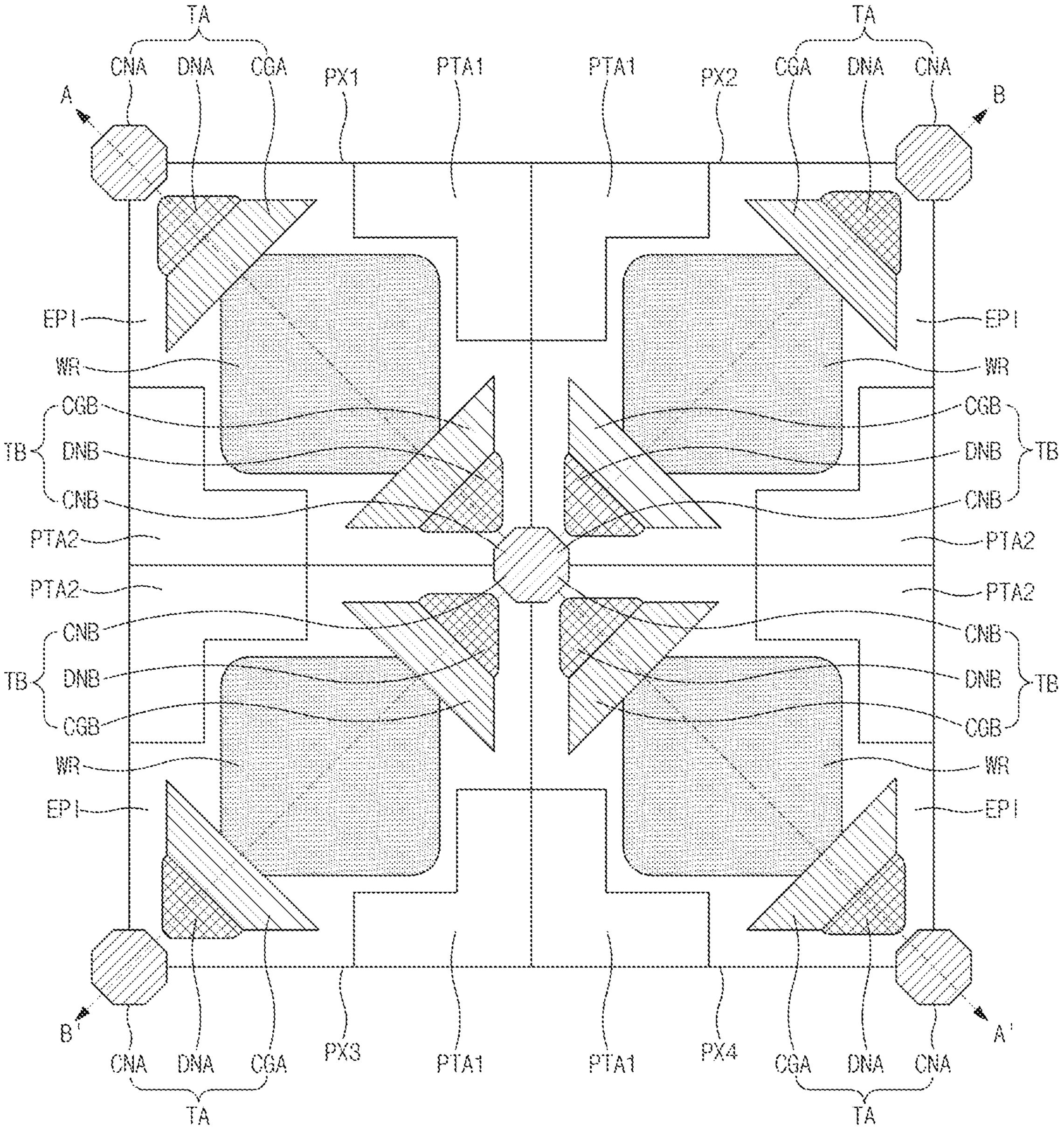
FIG. 4 is a diagram illustrating an example of some parts of a pixel array including the pixel shown in FIG. 2 based on some implementations of the disclosed technology.

FIG. 4 is a diagram illustrating an example of some parts of the pixel array including the pixel shown in FIG. 2 based on some implementations of the disclosed technology.

Referring to FIG. 4, there is shown an example in which the pixel PX and other pixels corresponding to the pixel PX are arranged. FIG. 4 shows first to fourth pixels PX1 to PX4 that are arranged in a (2×2) matrix, and each of the first to fourth pixels PX1 to PX4 may be any one of the pixels (PXs) shown in FIG. 1. For convenience of description, although FIG. 4 shows only four pixels PX1 to PX4 as an example, the scope of the disclosed technology is not limited thereto, and substantially the same structure and operation can also be applied to any other pixels included in the pixel array 30.

The first pixel PX1 may have the same structure as the pixel PX shown in FIG. 2, and the second pixel PX2 may have a symmetrical structure to the first pixel PX1 with respect to the boundary with the first pixel PX1, and the third pixel PX3 may have a symmetrical structure to the first pixel PX1 with respect to the boundary with the first pixel PX1. In addition, the fourth pixel PX4 may have a symmetrical structure to the first pixel PX1 with respect to the fourth vertex of the first pixel PX1, or may rotate 180° around the fourth vertex of the first pixel PX1 from the first pixel PX1.

In each pixel, the first and second control nodes CNA and CNB may be disposed at vertices facing each other in the first or second diagonal direction, such that four pixels that are adjacent to each other and form a (2×2) matrix may share a control node with each other.

Pixels arranged in a (2×2) matrix may share a control node, and may independently include a detection node and a control gate. As the pixels arranged in the (2×2) matrix share the control node without independently including the control node, the distance between the control nodes within any pixel can maximally increase.

A hole current that can contribute to flow of signal carriers may flow between the control node receiving the activation voltage and the other control node receiving the deactivation voltage. When an excessive hole current flows in the image sensing device ISD, power consumed in the image sensing device ISD may also excessively increase. As described above, as the distance between the control nodes within an arbitrary pixel maximally increases due to the arrangement shown in FIG. 4, resistance between the control nodes may also maximally increase, resulting in reduction in the magnitude of hole current.

In addition, as the pixels arranged in the (2×2) matrix share the control node, the number of control nodes required in the pixel array 30 is reduced to ¼ as compared to the case where each pixel independently includes the control node. As a result, from the viewpoint of the control circuits 41 and 42, load to which a voltage should be applied can be greatly reduced, so that power consumption of the image sensing device can also be greatly reduced. In addition, as the number of control nodes is reduced, a design margin required by miniaturization of each pixel can be guaranteed.

Figure 5:
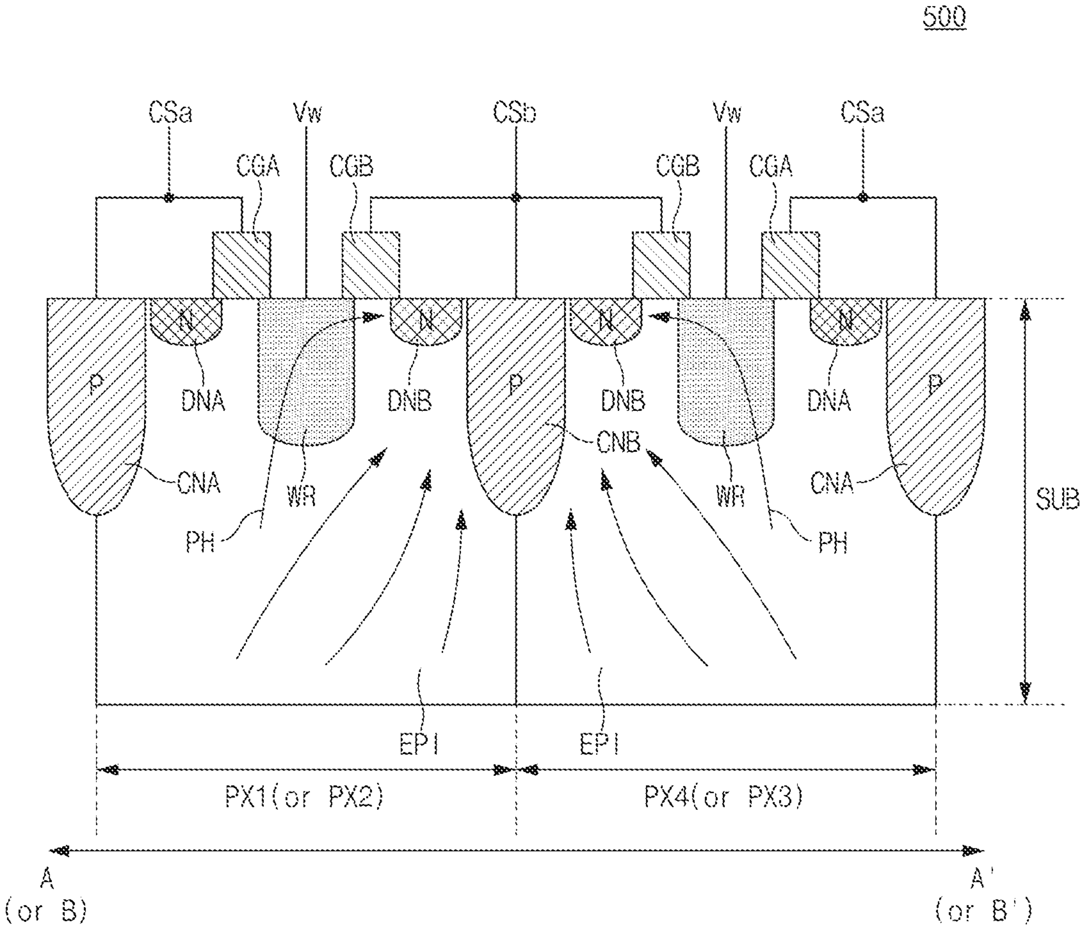
FIG. 5 is a cross-sectional view illustrating an example of the pixel array taken along a first or second cutting line shown in FIG. 4 based on some implementations of the disclosed technology.
Figure 6:
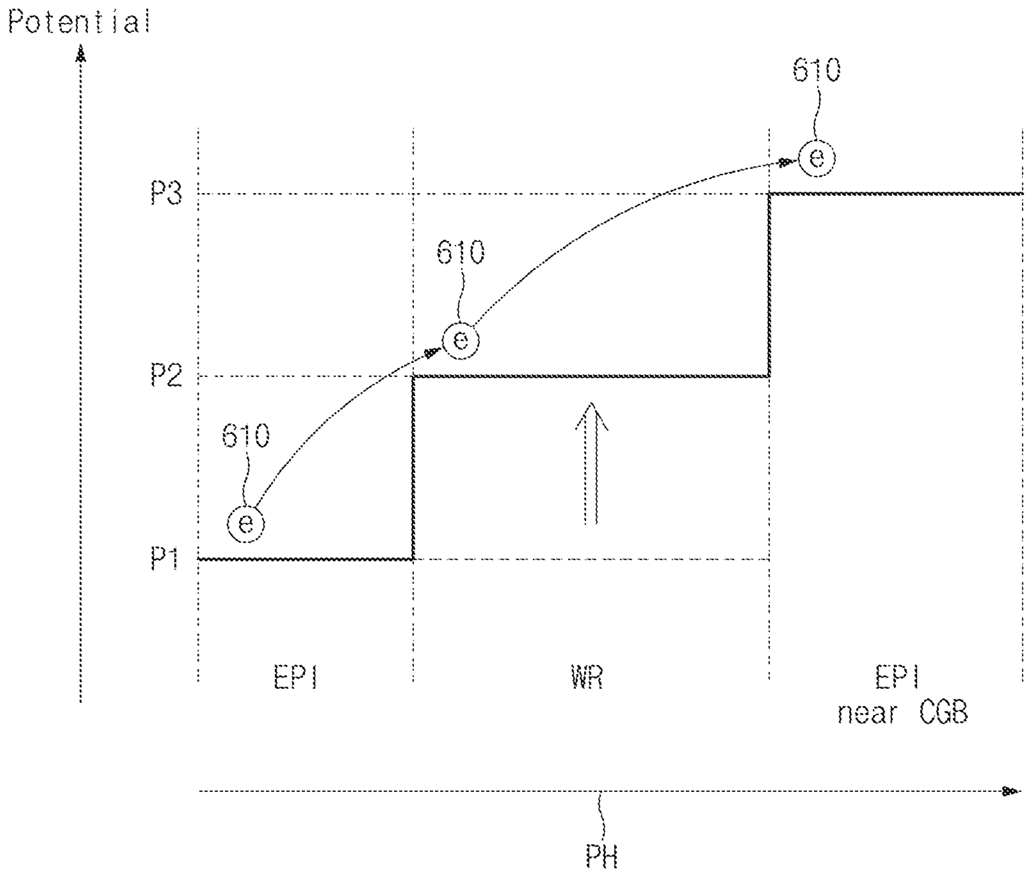
FIG. 6 is a graph illustrating an example of potential distribution appearing along movement paths shown in FIG. 5 based on some implementations of the disclosed technology.

FIG. 5 is a cross-sectional view illustrating an example of the pixel array taken along a first or second cutting line shown in FIG. 4 based on some implementations of the disclosed technology. FIG. 6 is a graph illustrating an example of potential distribution appearing along movement paths shown in FIG. 5 based on some implementations of the disclosed technology.

Referring to FIG. 5, a cross-sectional view 500 of the pixels PX1~PX4 taken along the first line A-A' or the second line B-B' is illustrated. When pixels are viewed along the first line A-A', the cross-sectional view of FIG. 5 may correspond to the first pixel PX1 and the fourth pixel PX4. When pixels are viewed along the second line B-B', the cross-sectional view of FIG. 5 may correspond to the second pixel PX2 and the third pixel PX3.

A substrate SUB may refer to the semiconductor substrate described above, and may be a substrate on which an epitaxial layer is grown. An epitaxial region EPI may be disposed in most regions of the substrate SUB.

The substrate SUB may include a top surface and a bottom surface facing or opposite to each other. Here, the top surface may refer to a front side (i.e., a front surface) of the substrate SUB, and the bottom surface may refer to a back side (i.e., a back surface) of the substrate SUB. Light reflected from modulated light may be incident upon the pixel through a back surface of the substrate SUB. The incident light may be converted into photocharges (i.e., electrons) in the epitaxial region EPI, and the photocharges may move along a potential gradient formed in the substrate SUB by the first and second demodulation control signals CSa and CSb.

The first and second control nodes CNA and CNB and the first and second detection nodes DNA and DNB may be formed in the substrate SUB to have a predetermined depth from the front surface of the substrate SUB. As shown in FIG. 5, the depth of each of the first and second control nodes CNA and CNB may be greater than the depth of each of the first and second detection nodes DNA and DNB. This is because it is difficult for photocharges to move through the first and second control nodes CNA and CNB, so that it is preferable that each of the first and second control nodes CNA and CNB be formed at a relatively deep depth. As a result, crosstalk, in which noise occurs when photocharges generated in any one pixel (e.g., PX1) are captured after moving toward another adjacent pixel (e.g., PX4), can be prevented.

In some implementations, the first and second control gates CGA and CGB may be disposed outside the substrate SUB at the front surface of the substrate SUB.

The first control node CNA and the first control gate CGA may receive the same first demodulation control signal (CSa), and the second control node CNB and the second control gate CGB may receive the same second demodulation control signal (CSb). In some other implementations, the control node and the control gate may receive different voltages. For example, in order for the control gate to indicate a potential gradient performance corresponding to the control node, a voltage (e.g., 2.8 V) applied to the control gate may be higher than a voltage (e.g., 1.2~1.5 V) applied to the control node. However, in order to reduce complexity of design and control, it is not desirable for the control node and the control gate to receive different voltages, and the thickness of a gate insulation layer included in the control gate may be set to a relatively small thickness in a manner that the control node and the control gate can receive the same voltage and the control gate can indicate the potential gradient performance corresponding to the control node. For example, the gate insulation layer included in the first or second control gate CGA or CGB may have a smaller thickness than the gate insulation layer of the transistor included in the first or second pixel transistor regions PTA1 or PTA2.

As can be seen from FIG. 5, when the first demodulation control signal (CSa) has a deactivation (inactive) voltage and the second demodulation control signal (CSb) has an activation (active) voltage, the movement paths of photocharges generated in response to the potential gradient are briefly illustrated.

Assuming that the epitaxial region EPI includes N-type impurities, each of the first and second control nodes CNA and CNB including P-type impurities may form a PN junction with the epitaxial region EPI, and a depletion region (not shown) may be formed around each of the first and second control nodes CNA and CNB.

When the activation voltage is applied to the second control node CNB and the deactivation (inactive) voltage is applied to the first control node CNA, the depletion region adjacent to the second control node CNB may instantaneously increase to maintain the PN junction, and the depletion region adjacent to the first control node CNA may have a relatively low potential. Accordingly, photocharges generated in the substrate may move around the second control node CNB having a high potential, and may be captured by the second detection node DNB.

In addition, when an activation voltage is applied to the second control gate CGB and a deactivation voltage is applied to the first control gate CGA, the potential of the region adjacent to a lower portion of the second control gate CGB may increase, and the potential of the region adjacent to a lower portion of the first control gate CGA may relatively decrease. Accordingly, photocharges generated in the substrate may move to a region adjacent to the lower portion of the second control gate CGB having a high potential, and may then be captured by the second detection node DNB.

In some implementations, the well region WR may be formed inside the substrate SUB to have a predetermined depth from the front surface of the substrate SUB. As shown in FIG. 5, the depth of the well region WR with respect to the front surface of the substrate SUB may be smaller than the depth of each of the first and second control nodes CNA and CNB with respect to the front surface of the substrate SUB.

The well region WR may be a region doped with impurities of a first conductivity type (e.g., P-type) at a predetermined doping density. Here, the doping density of the well region WR may be a doping density that is equal to or less than the doping density of the first and second control nodes CNA and CNB.

In addition, the well region WR may receive a predetermined well voltage (Vw). The well voltage (Vw) may be received from the row driver 41, and may be less than the activation voltage and greater than the deactivation voltage. In some other implementations, the well voltage (Vw) may be a deactivation voltage.

In some implementations, the well voltage (Vw) may be applied to the well region WR only in a time period (i.e., a period in which photocharges move toward the detection nodes) in which an activation voltage is applied to the control nodes or control gates. The operation for applying the well voltage (Vw) to the well region WR is required to provide a potential gradient for photocharge movement, so that unnecessary power consumption in a section where charge movement is not required can be reduced.

In this case, the reason why the well region WR has a smaller depth than each of the first and second control nodes CNA and CNB (i.e., a depth condition), the doping density of the well region WR is equal to or less than those of the first and second control nodes CNA and CNB (i.e., a density condition), and the well voltage (Vw) is set to a voltage corresponding to about an intermediate voltage between the activation voltage and the deactivation voltage (i.e., a voltage condition) is to allow the well region WR to have a potential corresponding to about an intermediate potential between the entire potential of the epitaxial region EPI and the potential of the region adjacent to the lower portion of the second control gate CGB configured to receive the activation voltage from among the epitaxial region EPI, without interfering with photocharge movement caused by the control nodes. As a result, photocharges can easily move along the potential gradient caused by the second control gate CGB.

The well region WR need not always satisfy the depth condition, the density condition, and the voltage condition. In some implementations, the well region WR may be implemented to have about an intermediate potential using at least one of the depth condition, the density condition, and the voltage condition.

FIG. 5 exemplarily shows a plurality of paths through which photocharges can move along the potential gradient caused by the control nodes and the control gates. The movement path PH may pass from the epitaxial region EPI to the well region WR, so that the movement path PH may move toward the second detection node DNB after passing through a region adjacent to the lower portion of the second control gate CGB.

FIG. 6 illustrates a distribution of potential flowing in the epitaxial region EPI along the movement path PH, a distribution of potential flowing in the well region WR along the movement path PH, and a distribution of potential flowing in a region (denoted by "EPI near CGB") adjacent to the lower portion of the second control gate CGB along the movement path PH.

Assuming that the epitaxial region EPI has a first potential P1, the region (EPI near CGB) adjacent to the lower portion of the second control gate CGB receiving the activation voltage may have a third potential P3 that is much higher than the first potential P1.

In addition, the well region WR may have a second potential P2 that is higher than the potential of the epitaxial region EPI and is lower than the potential of the region (EPI near CGB) adjacent to the lower portion of the second control gate CGB to which the activation voltage is applied.

As the potential gradient in which a potential sequentially increases in the order of the epitaxial region→the well region WR→the region (EPI near CGB) adjacent to the lower portion of the second control gate CGB is formed, photocharges 610 generated in the epitaxial region EPI may easily move toward the "EPI near CGB" region adjacent to the lower portion of the second control gate CGB through the well region WR, so that the photocharges 610 which have moved to the "EPI near CGB" region can be easily captured by the second detection node DNB.

Assuming that there is no well region WR, photocharges generated at a specific position (e.g., a starting point of the movement path PH of FIG. 5) need to immediately move toward the region (EPI near CGB) adjacent to the lower portion of the second control gate CGB. However, the region (EPI near CGB) adjacent to the lower portion of the second control gate CGB may be spaced apart from the corresponding photocharges by a relatively long distance. In this case, a sufficiently high voltage needs to be applied to the second control gate CGB to allow the photocharges to move the relatively long distance. However, the magnitude of voltage applied to the second control gate CGB is limited to a certain level to reduce power consumption.

Accordingly, some photocharges may not be captured by the second detection node DNB, and may deteriorate photoelectric conversion efficiency of pixels. In addition, as photocharges are captured in another time interval or in adjacent pixels, the photocharges may act as noise.

As the well region WR is disposed and a region having an intermediate potential is added (as the potential increases in the direction of the arrow shown in FIG. 6), a range that can be affected by the potential gradient can extend in size, and the potential gradient is effectively provided in the lateral direction by the control gate, so that the photocharges can be more smoothly moved and collected.

In accordance with the pixel PX of the disclosed technology, a diffusion-type control structure using the control node and a gate-type control structure using the control gate are arranged together, so that capture performance of photocharges can be maximized.

Figure 7A:
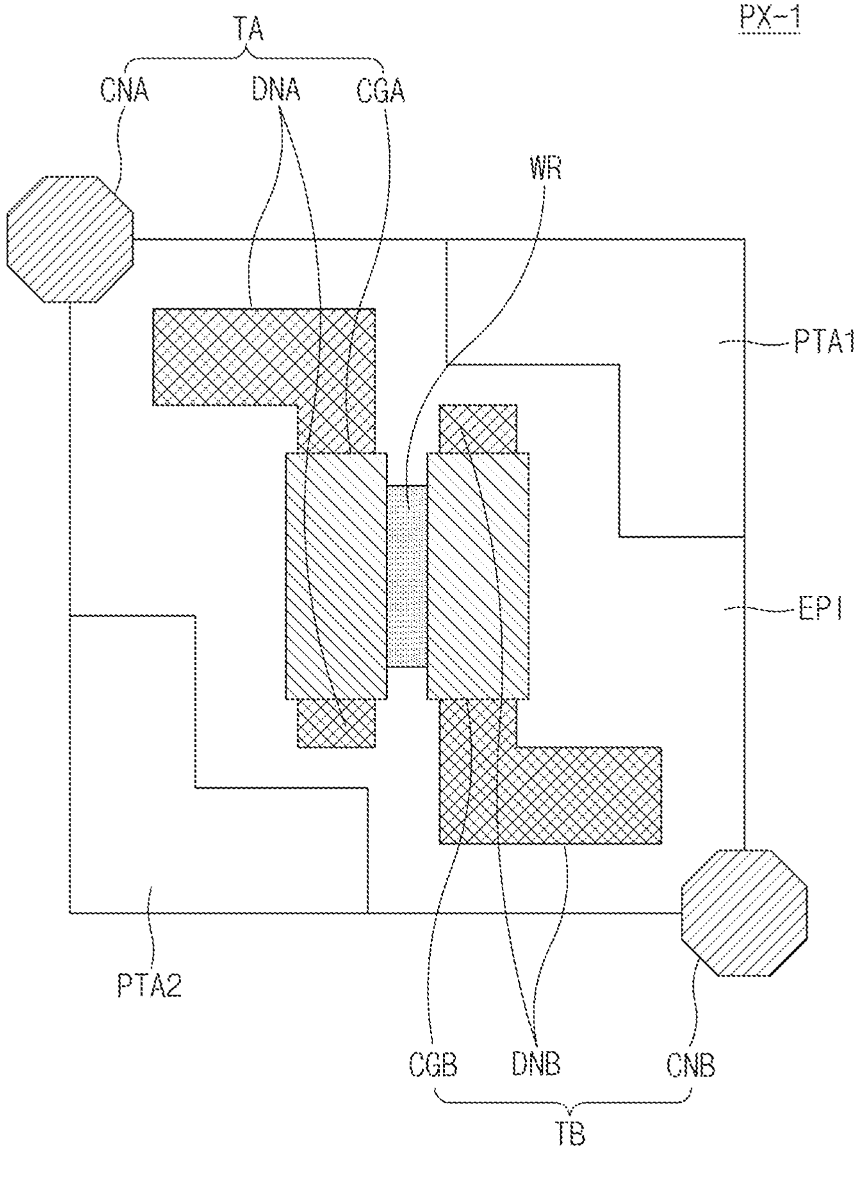
FIG. 7A is a diagram illustrating another example of the pixel shown in FIG. 2 based on some implementations of the disclosed technology.

FIG. 7A is a diagram illustrating another example of the pixel shown in FIG. 2 based on some implementations of the disclosed technology.

Referring to FIG. 7A, the pixel PX-1 may correspond to a modified example of the pixel PX shown in FIG. 2. The remaining parts of the pixel PX-1 shown in FIG. 7A other than some characteristics different from those of the pixel PX shown in FIG. 2 may be substantially identical in structure to the pixel PX shown in FIG. 2, and as such redundant description thereof will herein be omitted for brevity.

The first and second control gates CGA and CGB may be disposed closer to the center of the pixel PX-1. In addition, each of the first and second control gates CGA and CGB may be formed in a rectangular shape. As the first and second control gates CGA and CGB are disposed close to each other in the vicinity of the center of the pixel PX-1, the electric field generated by the first control gate CGA and the second control gate CGB may be more strongly formed.

In addition, the well region WR may be disposed between the first control gate CGA and the second control gate CGB in a manner that at least a portion thereof overlaps with each of the first control gate CGA and the second control gate CGB. As a result, a potential gradient toward each of the first control gate CGA and the second control gate CGB can be effectively formed.

In some implementations, the first detection node DNA may be formed in a clamp shape that includes a region extending toward the first control node CNA and a region overlapping at least a portion of the first control gate CGA. In addition, the second detection node DNB may be formed in a clamp shape that includes a region extending toward the second control node CNB and a region overlapping at least a portion of the second control gate CGB. Due to the above-described shapes of the first and second detection nodes DNA and DNB, photocharges moving along the potential gradient formed by the control nodes CNA and CNB and the control gates CGA and CGB can be more easily captured.

Figure 7B:
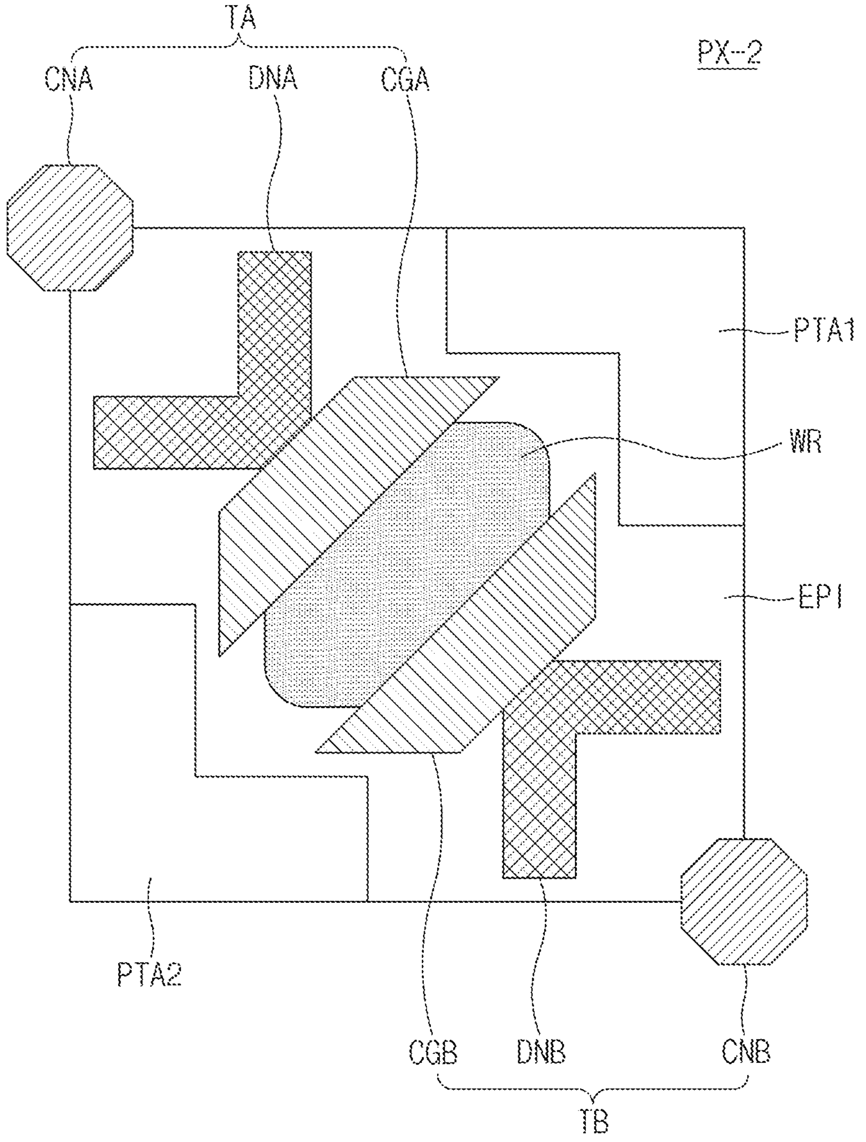
FIG. 7B is a diagram illustrating still another example of the pixel shown in FIG. 2 based on some implementations of the disclosed technology.

FIG. 7B is a diagram illustrating still another example of the pixel shown in FIG. 2 based on some implementations of the disclosed technology.

Referring to FIG. 7B, the pixel PX-2 may correspond to a modified example of the pixel PX shown in FIG. 2. The remaining parts of the pixel PX-2 shown in FIG. 7B other than some characteristics different from those of the pixel PX shown in FIG. 2 may be substantially identical in structure to the pixel PX shown in FIG. 2, and as such redundant description thereof will herein be omitted for brevity.

Each of the first and second control gates CGA and CGB may be disposed closer to the center of the pixel PX-2 while having a trapezoidal shape in the same manner as in FIG. 2. In addition, as the first and second control gates CGA and CGB are disposed closer to the center of the pixel PX-2, the first and second control gates CGA and CGB can be arranged in a wider region. As a result, the electric field generated by the first control gate CGA and the second control gate CGB may be more strongly formed.

In addition, the well region WR may be disposed between the first control gate CGA and the second control gate CGB in a manner that at least a portion thereof overlaps with each of the first control gate CGA and the second control gate CGB. As a result, a potential gradient toward each of the first control gate CGA and the second control gate CGB can be effectively formed.

In some implementations, the first detection node DNA may be formed in a clamp shape that includes a region extending toward the first control node CNA while surrounding the first control node CNA, and at least a portion of the first detection node DNA may overlap or contact the first control gate CGA. In addition, the second detection node DNB may be formed in a clamp shape that includes a region extending toward the second control node CNB while surrounding the second control node CNB, and at least a portion of the second detection node DNB may overlap or contact the second control gate CGB. Due to the above-described shapes of the first and second detection nodes DNA and DNB, photocharges moving along the potential gradient formed by the control nodes CNA and CNB and the control gates CGA and CGB can be more easily captured.

As is apparent from the above description, the image sensing device based on some implementations of the disclosed technology can improve performance of a time of flight (ToF) pixel while reducing power consumed in the ToF pixel.

Although a number of illustrative embodiments have been described, it should be understood that modifications and enhancements to the disclosed embodiments and other embodiments can be devised based on what is described and/or illustrated in this patent document.

What is claimed is:

1. An image sensing device comprising:

a substrate including a back side structured to receive incident light and a front side opposite to the back side;

imaging pixels to receive the incident light from the back side and each imaging pixel structured to produce photocharge in response to received incident light;

a plurality of conductive contact structures configured to generate a potential gradient in the substrate and to capture photocharges that are generated in response to the incident light and move by the potential gradient; and a well region disposed between the plurality of conductive contact structures, wherein each conductive contact structure includes:

a control node doped with impurities of a first conductivity type in the substrate;

a detection node doped with impurities of a second conductivity type different from the first conductivity type in the substrate; and a control gate including a gate electrode and a gate insulation layer for electrically isolating the gate electrode and the substrate from each other, wherein the well region is doped with impurities of the first conductivity type, and wherein the well region doped with impurities of the first conductivity type has a smaller doping density than the control node doped with impurities of the first conductivity type.

2. The image sensing device according to claim 1, wherein:

at least a portion of the well region is disposed to overlap the control gate of each conductive contact structure.

3. The image sensing device according to claim 1, wherein:

the control node is disposed at one side of the detection node; and the control gate is disposed at the other side of the detection node.

4. The image sensing device according to claim 1, wherein:

the control node and the control gate are configured to receive a same demodulation control signal for generating the potential gradient.

5. The image sensing device according to claim 4, wherein:

the demodulation control signal applied to one of the plurality of conductive contact structures corresponds to an activation voltage; and the demodulation control signal applied to another one of plurality of the conductive contact structures corresponds to a deactivation voltage.

6. The image sensing device according to claim 5, wherein:

the well region is configured to receive a well voltage that is smaller than the activation voltage and is greater than the deactivation voltage.

7. The image sensing device according to claim 1, wherein:

a depth of the control node with respect to the front side is greater than a depth of the detection node with respect to the front side.

8. The image sensing device according to claim 1, wherein:

a depth of the well region with respect to the front side is smaller than a depth of the control node with respect to the front side.

9. The image sensing device according to claim 1, wherein:

the detection node is disposed to contact or overlap the control gate.

10. The image sensing device according to claim 1, wherein:

the detection node is disposed to surround at least a portion of the control node.

11. The image sensing device according to claim 1, wherein:

the plurality of conductive contact structures includes a first conductive contact structure and a second conductive contact structure that are included in a first pixel among the imaging pixels and receive different demodulation control signals, wherein a control node of the first conductive contact structure is disposed at a first vertex of the first pixel, and a control node of the second conductive contact structure is disposed at a fourth vertex, and wherein the first vertex and the fourth vertex are located along a diagonal direction of the first pixel.

12. The image sensing device according to claim 11, wherein:

a control node, a detection node, and a control gate of each of the first conductive contact structure and the second conductive contact structure are sequentially arranged toward a center point of the first pixel in the diagonal direction.

13. The image sensing device according to claim 11, wherein:

the control gate of each of the first conductive contact structure and the second conductive contact structure is disposed in a planar shape on the front side.

14. The image sensing device according to claim 11, wherein the imaging pixels further include second to fourth pixels adjacent to the first pixel form a (2×2) matrix and share the control node disposed at the fourth vertex of the first pixel.

15. An image sensing device comprising:

a substrate including a back side structured to receive incident light and a front side opposite to the back side;

an imaging pixel to receive the incident light from the back side and structured to produce photocharge in response to the received incident light;

a plurality of taps, each tap configured to generate a potential gradient in the substrate and to capture photocharges that are generated in response to the incident light and move by the potential gradient; and a well region disposed between the plurality of taps such that at least a portion of the well region overlaps with each of the plurality of taps, wherein each of the plurality of taps includes:

a control node doped with impurities of a first conductivity type in the substrate;

a detection node doped with impurities of a second conductivity type different from the first conductivity type in the substrate; and a control gate formed to include a gate electrode and a gate insulation layer for electrically isolating the gate electrode and the substrate from each other, wherein the control node, the detection node, and the control gate of a tap are sequentially arranged in a diagonal direction of a first pixel including the tap, and wherein the plurality of taps includes a first tap and a second tap that are included in the first pixel among the imaging pixels and receive different demodulation control signals.

16. The image sensing device of claim 15, wherein the well region has a portion overlapping the control gate of each tap.

17. An image sensing device comprising:

a substrate including a back side structured to receive incident light and a front side opposite to the back side;

a plurality of taps, each tap is configured to generate a potential gradient in the substrate and to capture photocharges that are generated in response to the incident light and move by the potential gradient; and a well region disposed between the plurality of taps, wherein each of the plurality of taps includes:

a control node doped with impurities of a first conductivity type in the substrate;

a detection node doped with impurities of a second conductivity type different from the first conductivity type in the substrate; and a control gate formed to include a gate electrode and a gate insulation layer for electrically isolating the gate electrode and the substrate from each other, wherein a depth of the well region from the front side is smaller than a depth of the control node from the front side, wherein the well region is doped with impurities of the first conductivity type, and wherein the well region doped with impurities of the first conductivity type has a smaller doping density than the control node doped with impurities of the first conductivity type.

18. The image sensing device of claim 17, wherein the well region has a portion overlapping the control gate of each tap.

* * * * *